US012669782B2

(12) United States Patent
Sawai

(10) Patent No.: US 12,669,782 B2
(45) Date of Patent: Jun. 30, 2026

(54) LIGHT SOURCE DEVICE AND METHOD OF ASSEMBLING LIGHT SOURCE DEVICE

(71) Applicant: CASIO COMPUTER CO., LTD., Tokyo (JP)

(72) Inventor: Masashi Sawai, Hamura (JP)

(73) Assignee: CASIO COMPUTER CO., LTD., Tokyo (JP)

( * ) Notice: Subject to any disclaimer, the term of this patent is extended or adjusted under 35 U.S.C. 154(b) by 358 days.

(21) Appl. No.: 18/459,518

(22) Filed: Sep. 1, 2023

(65) Prior Publication Data

US 2024/0077835 A1     Mar. 7, 2024

(30) Foreign Application Priority Data

Sep. 2, 2022     (JP) ................................. 2022-140120

(51) Int. Cl.
*G04B 19/30*          (2006.01)
*H10H 20/831*         (2025.01)
*H10H 20/857*         (2025.01)

(52) U.S. Cl.
CPC ........... *G04B 19/30* (2013.01); *H10H 20/831* (2025.01); *H10H 20/857* (2025.01)

(58) Field of Classification Search
None
See application file for complete search history.

(56) References Cited

FOREIGN PATENT DOCUMENTS

| | | | | | |
|---|---|---|---|---|---|
| JP | S55105968 U | * | 7/1980 | ............. | G09F 13/20 |
| JP | 2006266843 A | | 10/2006 | | |

OTHER PUBLICATIONS

Google image translation (to obtain inventor name) of front page of JP S55-105968-U (1980) (Year: 2025).*
Scanned original of JP S55-105968 from JPO (Year: 2025).*
Espacenet combined translation of JP S55105968 (Year: 2025).*
Notice of Reasons for Refusal dated Aug. 6, 2024 received in Japanese Patent Application No. 2022-140120.

* cited by examiner

*Primary Examiner* — Regis J Betsch
*Assistant Examiner* — Michael James Walker
(74) *Attorney, Agent, or Firm* — Scully, Scott, Murphy & Presser, P.C.

(57)          ABSTRACT

Disclosed is a light source device including: a light emitter; an electrode including a support that supports the light emitter and a terminal that extends from the support in an opposite direction of a light emitting direction of the light emitter; a second restrictor that restricts a movement of the electrode in a second direction perpendicular to the light emitting direction; and a third restrictor that restricts a movement of the electrode in a third direction perpendicular to both of the light emitting direction and the second direction.

22 Claims, 7 Drawing Sheets

CASE MEMBER

LEAD

LED

UP

DOWN

LEAD

CASE MEMBER

LED

UP

DOWN

LEAD

CASE MEMBER

LED

UP

DOWN

LIGHT SOURCE DEVICE AND METHOD OF ASSEMBLING LIGHT SOURCE DEVICE

REFERENCE TO RELATED APPLICATIONS

This application is based upon and claims the benefit of priority from the prior Japanese Patent Application No. 2022-140120, filed on Sep. 2, 2022, the entire contents of which are incorporated herein by reference.

TECHNICAL FIELD

The present disclosure relates to a light source device and a method of assembling a light source device.

DESCRIPTION OF THE RELATED ART

JP 2006-266843 A discloses a light source device mounted on a timepiece to illuminate a time display part.

SUMMARY OF THE INVENTION

There is provided a light source device including: a light emitter; an electrode including a support that supports the light emitter and a terminal that extends from the support in an opposite direction of a light emitting direction of the light emitter; a second restrictor that restricts a movement of the electrode in a second direction perpendicular to the light emitting direction; and a third restrictor that restricts a movement of the electrode in a third direction perpendicular to both of the light emitting direction and the second direction.

BRIEF DESCRIPTION OF THE DRAWINGS

The accompanying drawings are not intended as a definition of the limits of the disclosure but illustrate embodiments of the disclosure, and together with the general description given above and the detailed description of the embodiments given below, serve to explain the principles of the disclosure, wherein.

DETAILED DESCRIPTION OF THE PREFERRED EMBODIMENTS

An embodiment of the present disclosure will be described with reference to FIGS. 1 to 6C.

Although various technically desirable limitations are attached to the embodiments described below for carrying out the present disclosure, the scope of the present disclosure is not limited to the following embodiments and illustrated examples.

Figure 1:
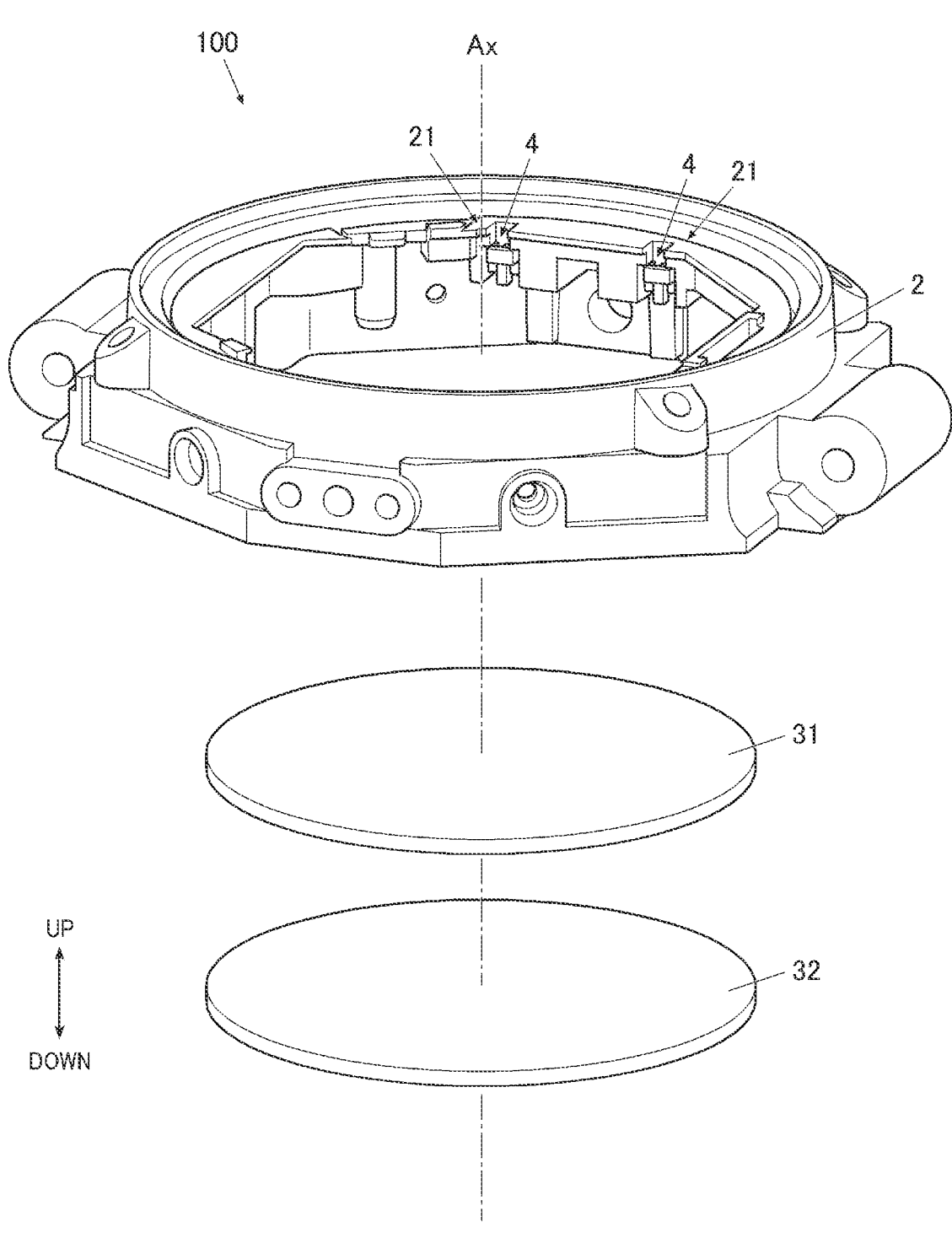
FIG. 1 is an exploded perspective view of essential parts of a timepiece according to an embodiment.
Figure 2:
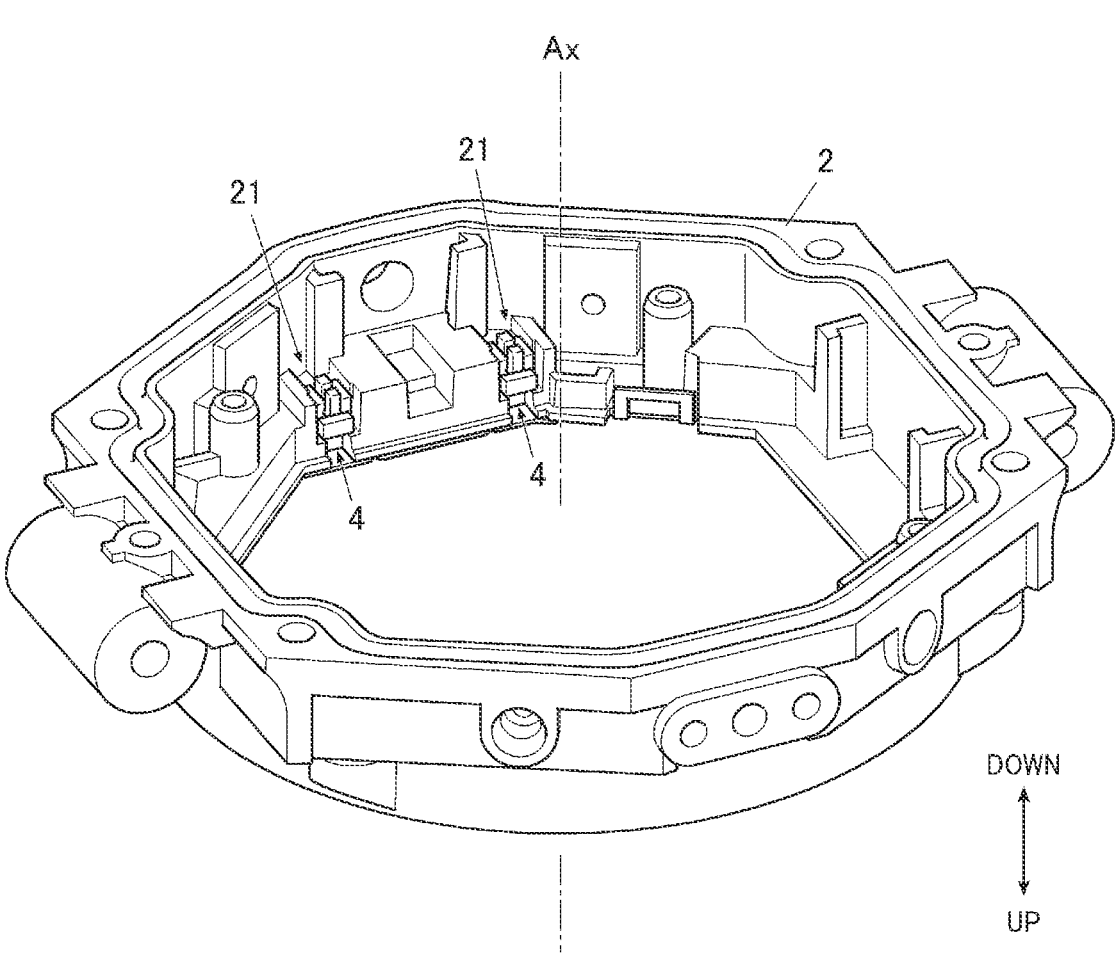
FIG. 2 is a perspective view of a body case according to the embodiment as seen from the rear side.

FIG. 1 is an exploded perspective view of essential parts of a timepiece 100 according to the present embodiment, and FIG. 2 is a perspective view of a body case 2 of the timepiece 100 as seen from the rear side.

In the following description, the up-down direction (second direction) refers to the front surface to back surface direction of the timepiece 100 (body case 2) (the front surface side is the upper side and the back surface side is the lower side). Also, the direction perpendicular to the central axis Ax of the timepiece 100 along the up-down direction is called the "radial direction", and the rotational direction about the central axis Ax is called the "circumferential direction".

Figures 7A, 7B, 7C:
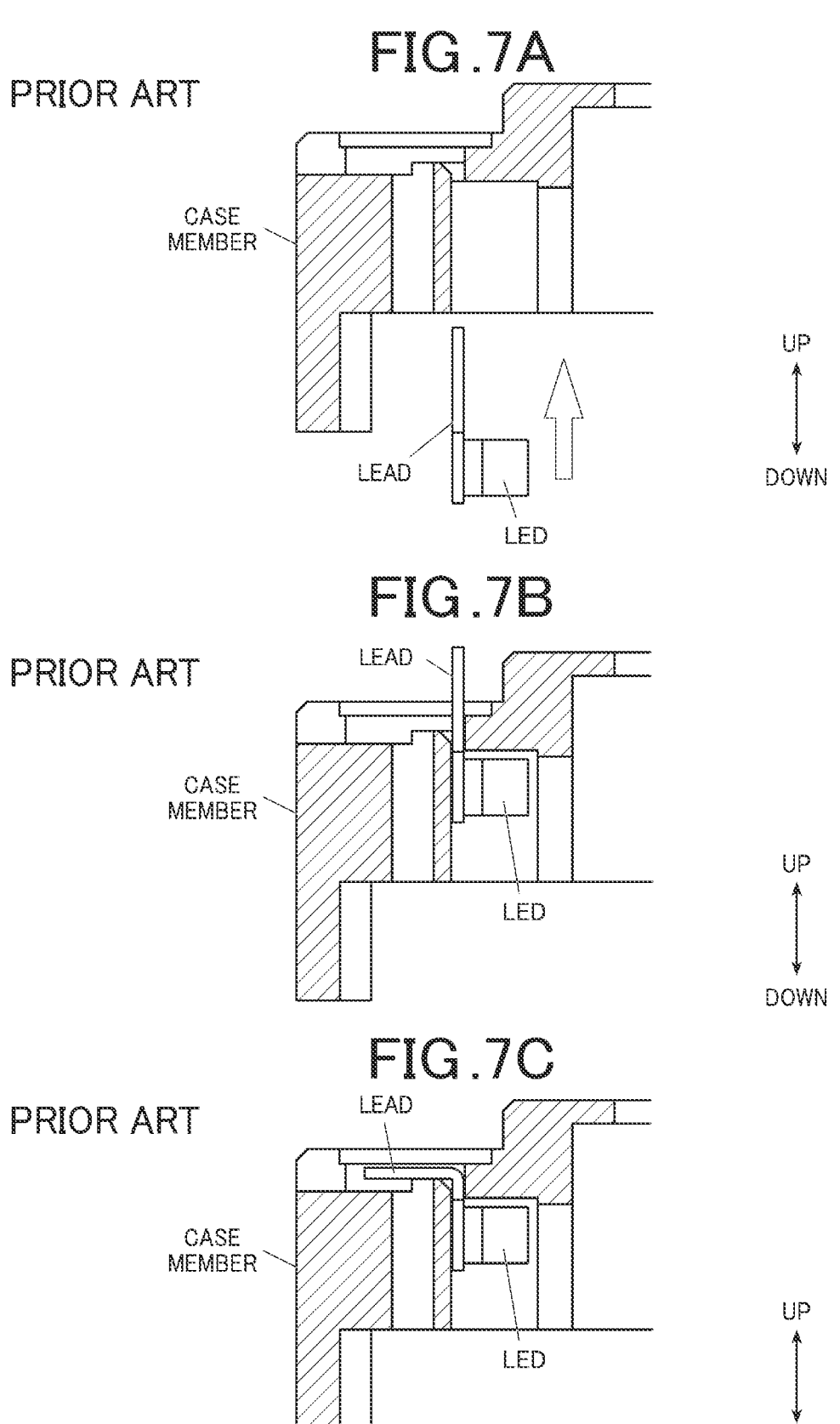
FIGS. 7A to 7C are diagrams for explaining a procedure for attaching a conventional light emitting member to a case member.

Conventionally, LEDs (light emitting diodes) with lead terminals may be employed as light emitting members. As shown in FIGS. 7A to 7C, this light emitting member has each terminal (lead) inserted into a hole in a case member from the up-down direction perpendicular to the light emitting direction (right side in the drawing), and after insertion, the lead is bent. Thereby, the light emitting member is fixed to the case member.

However, the structure in which the lead is bent to position and fix the light emitting member has the following problems.

Since the position in the up-down direction of the light emitting member is determined by the bent position of the lead, the positional accuracy of the light emitting member in the up-down direction deteriorates according to variations in the bent position.

When the light emitting member once incorporated is removed from the case member, it is necessary to restore the bend of the lead. Therefore, when removing the light emitting member, there is an additional step of unbending the lead, and it is necessary to be able to access the light emitting member fixed to the case member from both sides in the up-down direction.

A light source device and a method of assembling the light source device that can improve such a situation and suitably fix the light emitting member will be described below.

As shown in FIG. 1, a timepiece 100 according to the present embodiment is an example of a light source device according to the present disclosure and is a wristwatch worn on a user's wrist. The timepiece 100 has a body case 2 that is formed in a substantially cylindrical shape when viewed from the front. The body case 2 is made of hard resin such as ABS (Acrylonitrile Butadiene Styrene) resin, although not particularly limited.

The body case 2 accommodates a timepiece body including a liquid crystal panel 31 and a light guide plate 32.

Both the liquid crystal panel 31 and the light guide plate 32 are formed in a substantially disc shape and arranged in this order from the front side. The liquid crystal panel 31 is arranged so as to be visible from the front through a windshield member (not shown) and displays various information including the time. The light guide plate 32 is a backlight for the liquid crystal panel 31, and guides light from the light emitting member 4, which will be described later, to illuminate the liquid crystal panel 31 from the back side.

As shown in FIG. 2, light emitting members 4 for illuminating the liquid crystal panel 31 through the light guide plate 32 are arranged inside the body case 2. The light emitting members 4 are not particularly limited but are arranged at two locations on the side portion of the body case 2 on the 3 o'clock direction side and slightly spaced apart in the circumferential direction.

Figures 3A, 3B:
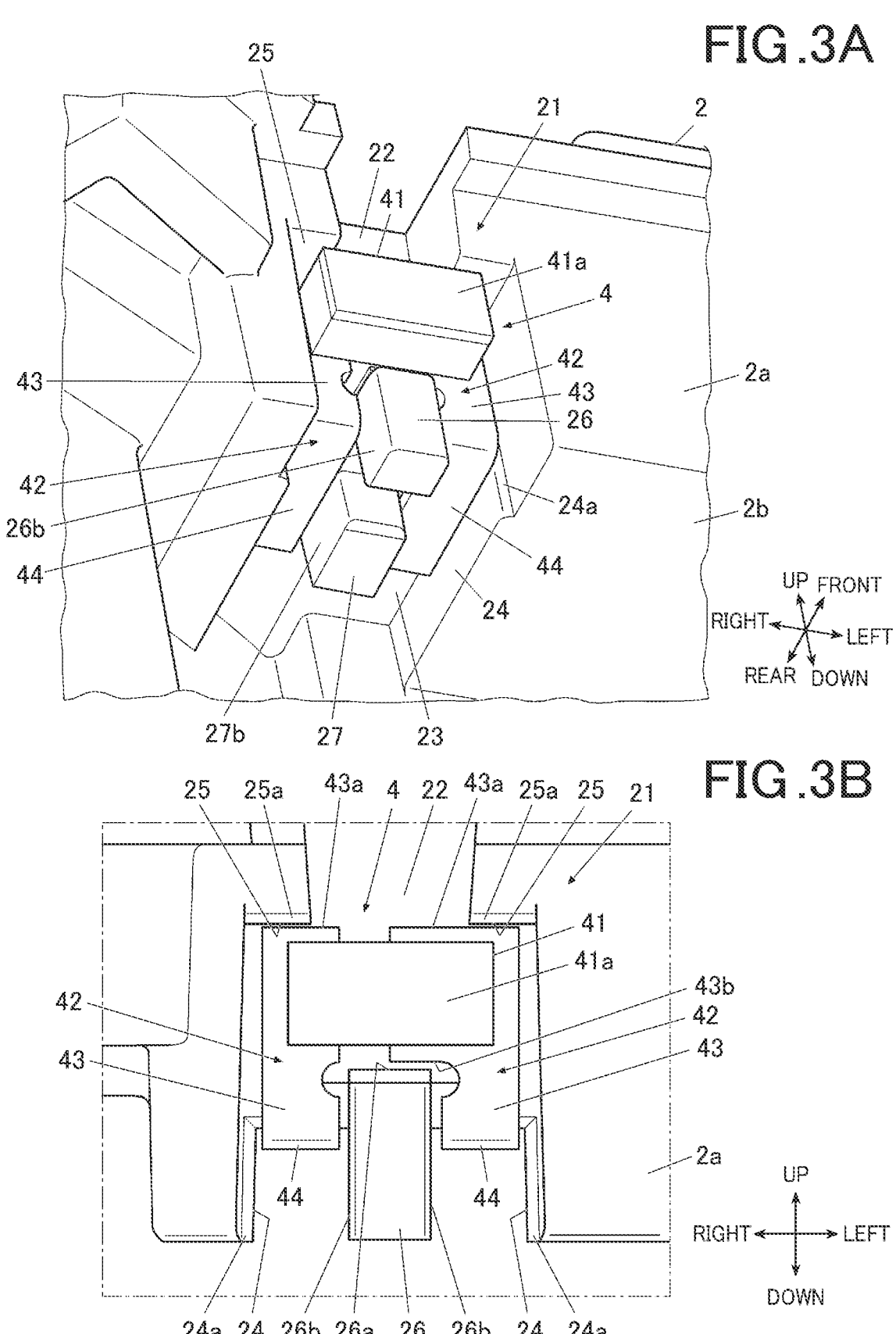
FIG. 3A is a perspective view of a light emitting member arranged on an LED fixing portion of the body case according to the embodiment.
FIG. 3B is a front view of the light emitting member arranged on the LED fixing portion of the body case according to the embodiment.
Figure 4:
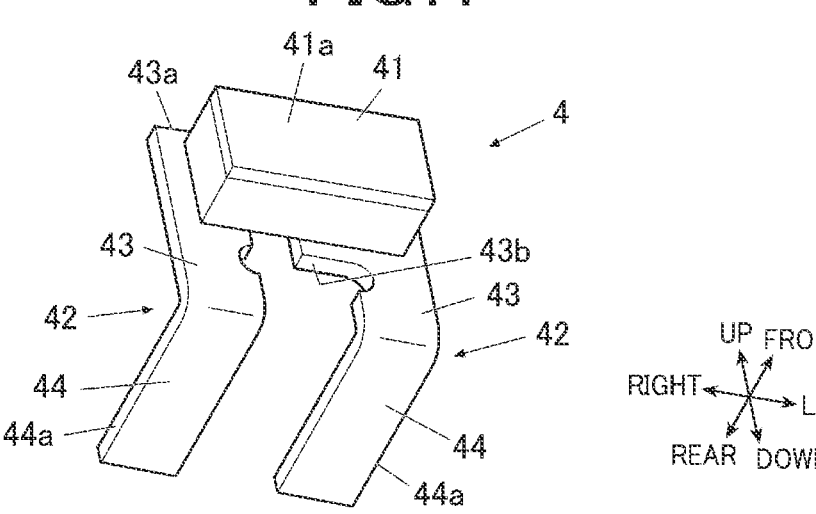
FIG. 4 is a perspective view of the light emitting member according to the embodiment.
Figure 5:
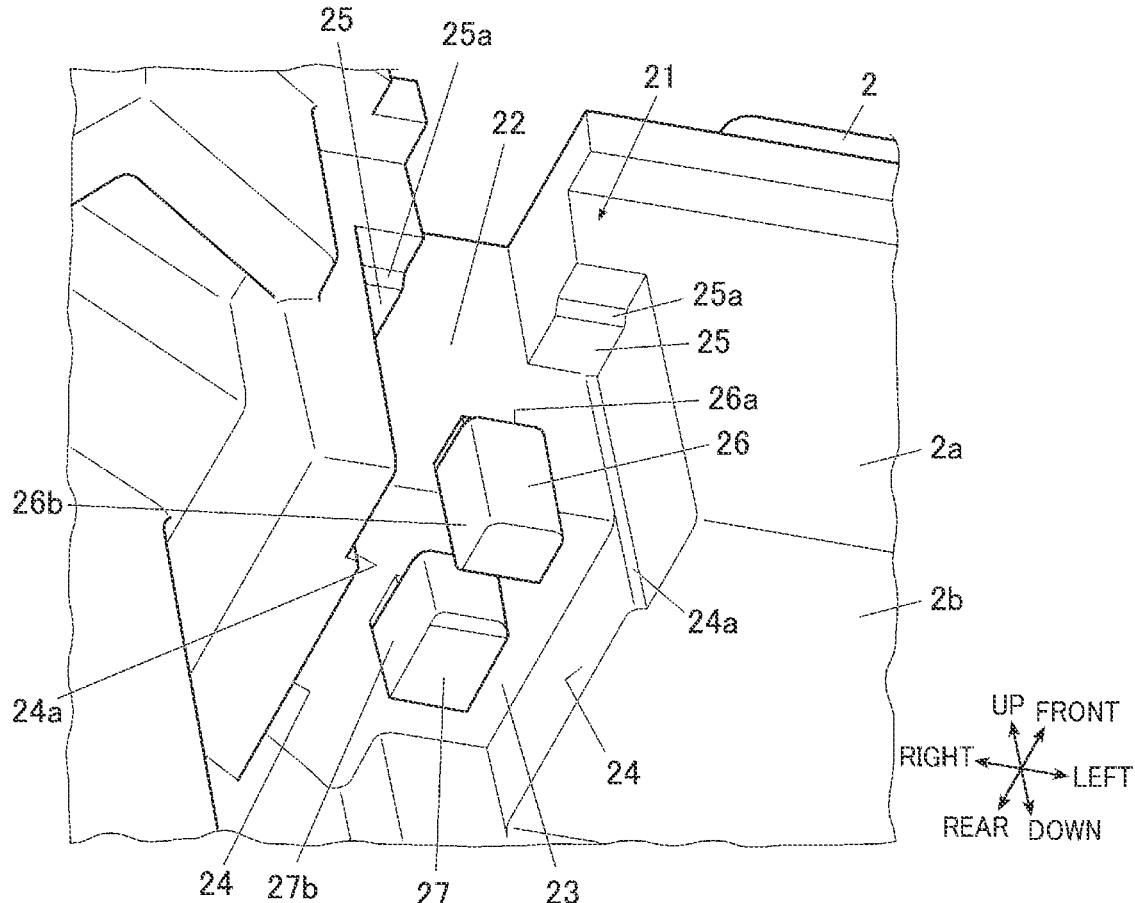
FIG. 5 is a perspective view of the LED fixing portion of the body case according to the embodiment.

FIGS. 3A and 3B are a perspective view and a front view of the light emitting member 4 arranged on an LED fixing portion 21 of the body case 2. FIG. 4 is a perspective view of the light emitting member 4, and FIG. 5 is a perspective view of the LED fixing portion 21 of the body case 2.

As shown in these figures, the light emitting member 4 is an LED (light emitting diode) with lead terminals in the present embodiment and has a light emitter 41 and two electrodes 42.

The light emitter 41 is sealed with resin and formed in a rectangular parallelepiped shape. The light emitter 41 is supported by the electrodes 42 on the back surface opposite to the light emitting surface 41a with the light emitting surface 41a directed toward the inward radial side of the body case 2. The incident surface of the light guide plate 32 is arranged to face the light emitting surface 41a while the light emitting member 4 is arranged in the body case 2 (see FIG. 6C).

In the following description, front, rear, left, and right directions are referred to as viewed from the light emitter 41 (light emitting surface 41a). That is, the inward radial direction of the body case 2, which is the light emitting direction in which the light emitting surface 41a faces, is "forward", the outward radial direction which is the opposite direction of the inward radial direction is "rearward", and the direction tangential to the circumferential direction of the body case 2 is "left-right direction".

The two electrodes 42 are each formed in a substantially L-shape when viewed from the side. In a state in which their positions in the front-rear direction and in the up-down direction (second direction) perpendicular to the light emitting direction are substantially aligned with each other and are arranged in parallel in the left-right direction (third direction) perpendicular to both the light emitting direction and the second direction. Specifically, each electrode 42 has a support 43 and a terminal 44.

The support 43 is attached to the rear surface of the light emitter 41 to support the light emitter 41. More specifically, the support 43 is formed in a flat plate shape substantially perpendicular to the front-rear direction, and the light emitter 41 is attached to the substantially upper half portion thereof.

The terminal 44 is formed in a flat plate shape substantially perpendicular to the up-down direction and extends rearward from the lower end of the support 43.

The body case 2 is formed with LED fixing portions 21 on each of which the light emitting member 4 is arranged.

The LED fixing portion 21 is formed in a concave shape recessed from both the inner peripheral surface 2a and the lower end surface 2b of the body case 2 and accommodates the light emitting member 4 inside the concave shape. Specifically, the LED fixing portion 21 has a front bottom surface 22 and a lower bottom surface 23.

The front bottom surface 22 is formed in a planar shape substantially perpendicular to the front-rear direction. The front bottom surface 22 faces the rear surface of the support 43 of each electrode 42 to restrict the rearward movement of the light emitting member 4 when the light emitting member 4 is arranged on the LED fixing portion 21. The front bottom surface 22 is an example of a first restrictor according to the present disclosure.

The lower bottom surface 23 is formed in a planar shape substantially perpendicular to the up-down direction and extends rearward from the lower end of the front bottom surface 22. The lower bottom surface 23 faces the upper surface of the terminal 44 of each electrode 42 when the light emitting member 4 is arranged on the LED fixing portion 21.

When the light emitting member 4 is arranged on the LED fixing portion 21, the inner side surfaces 24 on both the left and right sides of the front bottom surface 22 and the lower bottom surface 23 in the LED fixing portion 21 restrict the movement of the light emitting member 4 in the left-right direction (third direction) by facing the side surfaces 44a on the outer sides in the left-right direction (third direction) of the respective terminals 44. The inner side surface 24 is an example of a third restrictor and a second facing surface according to the present disclosure. The third restrictor restricts movement of the light emitting member 4 in the left-right direction (third direction).

Both inner side surfaces 24 of the LED fixing portion 21 are each formed in a stepped shape having a stepped portion 24a. The inner side surface 24 is formed so that the width of the LED fixing portion 21 in the left-right direction (that is, the distance between the inner side surfaces 24) gradually narrows toward the rear across the stepped portion 24a. In the stepped portion 24a, sharpness of its edge is removed so that the front and rear surfaces are smoothly connected to smoothly insert the light emitting member 4. Further, in the present embodiment, the stepped portion 24a is formed at a position in the front-rear direction substantially matching the front bottom surface 22. With this stepped portion 24a, the light emitting member 4 can be easily inserted into the opening on the front side (front side of the stepped portion 24a) of the LED fixing portion 21, and the movement of the light emitting member 4 in the left-right direction is restricted as the light emitting member 4 is inserted rearward behind the stepped portion 24a.

Of the LED fixing portion 21, the upper side surface 25 protruding forward from the upper portion of the front bottom surface 22 faces the upper end surface 43a of each support 43 and restricts upward movement of the light emitting member 4 when the light emitting member 4 is arranged on the LED fixing portion 21. This upper side surface 25 is an example of a second restrictor and a first facing surface according to the present disclosure.

Further, the upper side surface 25 of the LED fixing portion 21 is formed in a stepped shape having a stepped portion 25a. The upper side surface 25 is formed so as to be located stepwise downward across the stepped portion 25a toward the rear. In the stepped portion 25a, sharpness of its edge is removed so that the subsequent surface is smoothly connected and the light emitting member 4 can be smoothly inserted. With this stepped portion 25a, the light emitting member 4 can be easily inserted into the opening on the front side (front side of the stepped portion 25a) of the LED fixing portion 21, and the upward movement of the light emitting member 4 is restricted as the light emitting member 4 is inserted rearward behind the stepped portion 25a.

The upper part of the LED fixing part 21 forming the upper side surface 25 of the body case 2 has a recessed cutout at the center in the left-right direction and has a bottom surface that is substantially flush with the front bottom surface 22. In other words, the upper side surface 25 restricts the movement of the light emitting member 4 at two locations, left and right. This cutout is shaped to allow a gripping member that grips the light emitting member 4 to escape when the light emitting member 4 is attached to or detached from the LED fixing portion 21.

Further, the LED fixing portion 21 has a first rib 26 and a second rib 27 protruding from the front bottom surface 22 and the lower bottom surface 23. The first rib 26 and the second rib 27 are arranged substantially in the center of the LED fixing portion 21 in the left-right direction (third direction) and are located between the two electrodes 42 arranged in parallel in the left-right direction when the light emitting member 4 is arranged on the LED fixing portion 21.

Among these, the first rib 26 protrudes from the lower portion of the front bottom surface 22. The first rib 26 protrudes forward beyond the front bottom surface 22 and downward beyond the lower bottom surface 23. The upper surface 26a of the first rib 26 faces the lower side surface 43b of the support 43 to restrict the downward movement of the light emitting member 4 when the light emitting member 4 is arranged on the LED fixing portion 21. The upper surface 26a of the first rib 26 is an example of a second restrictor according to the present disclosure. The second restrictor restricts movement of the light emitting member 4 in the up-down direction (second direction). More specifically, the lower side surface 43b of the support 43 is located on the center side of the light emitting member 4 in the left-right direction but is formed only on one of the two electrodes 42. Thus, the lower side surface 43b is formed on mainly either side of the center in the left-right direction of the light emitting member 4. The lower side surface 43b of the support 43 is located slightly below the light emitter 41.

The second rib 27 protrudes from the lower bottom surface 23 behind the first rib 26. The second rib 27 has substantially the same width in the left-right direction as the first rib 26. The position of the rear end of the second rib 27 substantially matches the position of the rear ends of the terminals 44 when the light emitting member 4 is arranged on the LED fixing portion 21.

Instead of (or together with) the inner side surfaces 24 on the left and right sides of the LED fixing portion 21, the left and right side surfaces 26b and 27b (third restrictor) of the first rib 26 and the second rib 27 may restrict the movement in the left-right direction of the light emitting member 4. That is, toward the front from the LED fixing portion 21, at least one of the left side surfaces 26b and 27b of the first rib 26 and the second rib 27 and the inner side surface 24 on the right side (third restrictor) may restrict the rightward movement of the light emitting member 4, and at least one of the right side surfaces 26b and 27b (third restrictor) of the first rib 26 and the second rib 27 and the inner side surface 24 on the left side (third restrictor) may restrict the leftward movement of the electrode 42 of the light emitting member 4.

In this case, the upper surface 26a of the first rib 26 is a second restrictor that restricts movement in the second direction (up-down direction), and the side surface 26b is a third restrictor that restricts movement in the third direction (left-right direction).

Therefore, since only the first rib 26 can serve as the second restrictor and the third restrictor, at least the first rib 26 only needs to be provided, and the second rib 27 does not need to be provided.

Alternatively, the first rib 26 may be a protruding portion including a second restrictor that restricts movement in the second direction (up-down direction), and the second rib 27 may be a protruding portion including a third restrictor that restricts movement in the third direction (left-right direction).

Also, the terminals 44 of the LED and the substrate (not shown) are connected by an interconnect (not shown) in which a metal wire is coated with resin or rubber. In order to pass this interconnect, a gap is provided between the first rib 26 and the second rib 27, and the interconnect is passed through this gap. The widths of the first rib 26 and the second rib 27 in the third direction (left-right direction) are substantially the same.

Although the first rib 26 and the second rib 27 are provided in the present embodiment, the configuration is not limited to this. If other connection members such as springs are used instead of interconnects, only one rib may be used, and no gaps may be provided. That is, the first rib 26 and the second rib 27 may be integrally formed. Furthermore, the rib may be divided into front and rear and/or left and right.

Next, a procedure for attaching the light emitting member 4 to the LED fixing portion 21 of the body case 2 will be described.

Figure 6A:
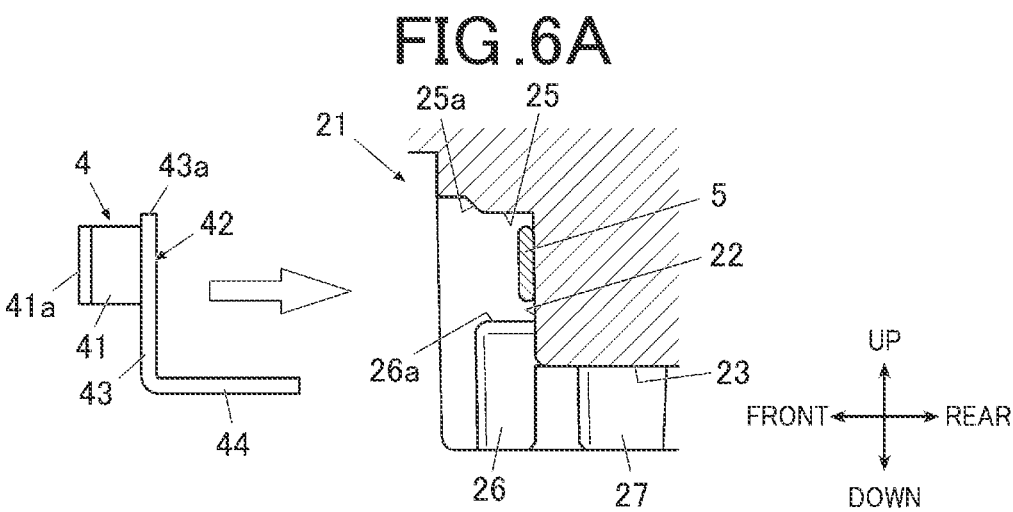
FIGS. 6A to 6C are diagrams for explaining the procedure for attaching the light emitting member according to the embodiment to the LED fixing portion of the body case.
Figure 6B:
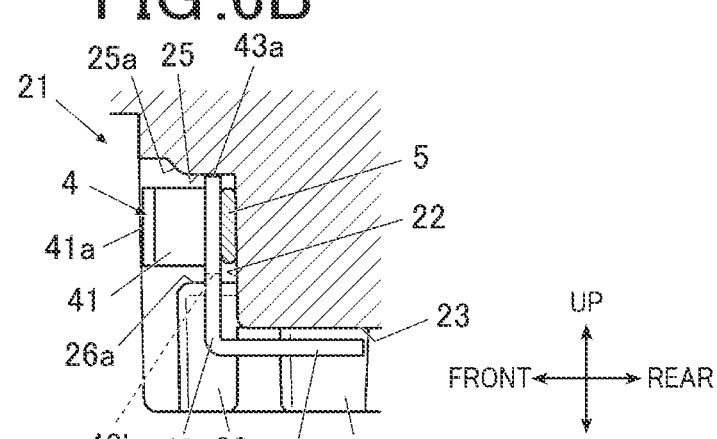
Figure 6C:
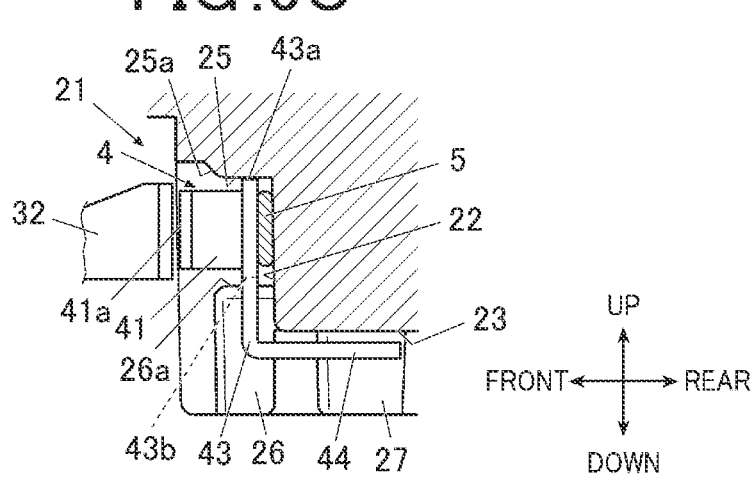

FIGS. 6A to 6C are diagrams for explaining the procedure for attaching the light emitting member 4 to the LED fixing portion 21.

As shown in FIG. 6A, the operator first attaches the double-sided tape 5 to the front bottom surface 22 of the LED fixing portion 21 of the body case 2.

Next, the operator inserts and fits the light emitting member 4 into the LED fixing portion 21 from the front (the inward radial side of the body case 2) along the terminals 44 while pinching the light emitting member 4 up and down with a jig or the like, for example.

Then, as shown in FIG. 6B, the rear surface of the support 43 is fixed to the front bottom surface 22 of the LED fixing portion with the double-sided tape 5. Thus, the front bottom surface 22 is made to face the support 43 rearwardly, and the rearward movement of the light emitting member 4 is restricted.

At this time, the light emitting member 4 is appropriately guided left and right by the left and right inner side surfaces 24 of the LED fixing portion 21 formed in a stepped shape and is inserted into the LED fixing portion 21 (see FIGS. 3A and 3B). When the light emitting member 4 is completely inserted, the movement in the left-right direction of the light emitting member 4 is restricted by the inner side surfaces 24 of the LED fixing portion 21 facing the side surfaces 44a of the terminals 44. That is, the movement of the electrodes 42 in the third direction (left-right direction) perpendicular to both the light emitting direction and the second direction (up-down direction) is restricted by the inner side surfaces 24 (third restrictor) of the LED fixing portion 21. That is, the light emitting member 4 is positioned in the left-right direction.

Similarly, the light emitting member 4 is inserted into the LED fixing portion 21 while being suitably guided by the upper side surfaces 25 of the LED fixing portion 21 formed in a stepped shape. When the light emitting member 4 is completely inserted, the upward movement of the light emitting member 4 is restricted by the upper side surfaces 25 of the LED fixing portion 21 facing the upper end surfaces 43a of the supports 43. Further, when the light emitting member 4 is completely inserted, the downward movement of the light emitting member 4 is restricted by the upper surface 26a of the first rib 26 of the LED fixing portion 21 facing the lower side surface 43b of the support 43. That is, the upper side surfaces 25 of the LED fixing portion 21 and the upper surface 26a of the first rib 26 position the light emitting member 4 in the up-down direction. That is, the upper side surfaces 25 of the LED fixing portion 21 and the upper surface 26a of the first rib 26 restrict movement of the electrodes 42 in the second direction (up-down direction) perpendicular to the light emitting direction.

In this way, the light emitting member 4 is positioned with respect to the LED fixing portion 21 while its movement in the up-down direction and the left-right direction is restricted.

Next, as shown in FIG. 6C, the operator places the light guide plate 32 in front of the light emitting surface 41a of the light emitter 41 so as to face the light emitting surface 41a.

As a result, forward movement of the light emitting member 4 is restricted. That is, the light emitting member 4 is positioned in the front-rear direction by the front bottom surface 22 of the LED fixing portion and the light guide plate 32.

As described above, according to the present embodiment, the terminals 44 of the electrodes 42 extend rearward (opposite to the light emitting direction of the light emitter 41) from the supports 43 that support the light emitter 41. Further, the upper side surfaces 25 of the LED fixing portion 21 and the upper surface 26a of the first rib 26 restrict the movement in the up-down direction of the electrodes 42 (supports 43). The inner side surfaces 24 of the LED fixing portion 21 restrict the movement in the left-right direction of the electrodes 42 (terminals 44).

Accordingly, by inserting the light emitting member 4 into the LED fixing portion 21 from the front side (light emitting direction side) along the terminals 44, the light emitting member 4 is positioned in the up-down direction by the upper side surfaces 25 and the first rib 26 of the LED fixing portion 21 and positioned in the left-right direction by the inner side surfaces 24 of the LED fixing portion 21. Therefore, the light emitting member 4 can be fixed to the body case 2 without bending the terminals 44, unlike the conventional light emitting member which is fixed by bending the terminals after inserting into the case member. That is, when removing the light emitting member 4 fixed to the body case 2, it is not necessary to restore the bent terminals as in the conventional case, and it is sufficient to pull out the light emitting member 4 to the inward radial side of the body case 2. Moreover, in this case, it is sufficient to grasp the light emitting member 4 from the inward radial side of the body case 2, and compared with the conventional structure in which it is necessary to access the light emitting member (terminals) fixed to the case member from two locations, the structural restriction is reduced. In addition, since the light emitting member 4 is positioned by the arrangement of each surface of the body case 2 (the LED fixing portion 21) and the light guide plate 32, the light emitting member 4 can be positioned with higher accuracy than in the conventional art in which the position is determined by the bent positions of the terminals.

Therefore, the light emitting member 4 can be suitably fixed.

Further, according to the present embodiment, the upper side surface 25 of the LED fixing portion 21 is formed in a stepped shape that is positioned stepwise downward toward the rear.

As a result, when the light emitting member 4 is placed in the LED fixing portion 21 from the front, the light emitting member 4 can be easily inserted in the opening on the front side of the LED fixing portion 21, and the upward movement of the light emitting member 4 is preferably restricted as the light emitting member 4 is inserted rearward.

Further, according to the present embodiment, the front bottom surface 22 of the LED fixing portion 21 faces the supports 43 on the rear side and restricts its movement to the rear side, and the light guide plate 32 faces the light emitting surface 41a (front surface of the light emitter 41).

Thereby, the light emitting member 4 is positioned in the front-rear direction by the front bottom surface 22 of the LED fixing portion 21 and the light guide plate 32. Therefore, the light emitting member 4 can be more preferably fixed.

Further, according to the present embodiment, the inner side surface 24 of the LED fixing portion 21 is formed in a stepped shape that protrudes stepwise toward the rear.

As a result, when the light emitting member 4 is placed in the LED fixing portion 21 from the front, the light emitting member 4 can be easily inserted in the opening on the front side of the LED fixing portion 21, and the movement in the left-right direction of the light emitting member 4 is preferably restricted as the light emitting member 4 is inserted rearward.

Further, according to the present embodiment, the light guide plate 32 that guides the light from the light emitter 41 faces the light emitting surface 41a of the light emitter 41 and restricts forward movement of the light emitting member 4.

As a result, the forward movement of the light emitting member 4 can be restricted without using another restricting member only for restricting the movement of the light emitting member 4.

It goes without saying that the embodiments to which the present disclosure can be applied are not limited to the above-described embodiments, and that various modifications are possible within the scope of the present disclosure.

For example, in the above embodiment, the upper side surface 25 of the LED fixing portion 21 is formed in a stepped shape having a stepped portion 25a in which sharpness of its edge is removed. However, the stepped portion 25a (having the sharpness removed) may be formed at the edge of the front end of the upper side surface 25 (the corner with the inner peripheral surface 2a of the body case 2). Similarly, for the inner side surfaces 24 on both the left and right sides of the LED fixing portion 21, stepped portions 24a (having the sharpness removed) may be formed at the front edges of the inner side surfaces 24 (corners with the inner peripheral surface 2a of the body case 2). Further, each of the upper side surfaces 25 and both inner side surfaces 24 of the LED fixing portion 21 may be formed into an inclined surface that gradually narrows toward the rear instead of having a stepped shape with stepped portions 24a, 25a.

In the above embodiment, the terminals (leads) 44 of the electrodes 42 are bent rearward, but they may be bent forward depending on the connection structure with the substrate, for example.

Furthermore, the bending angle of the terminal 44 does not have to be vertical (90°). The bending angle may be the bending angle in a range that can be regarded as substantially vertical (for example, ±5°), or even may be the bending angle (for example, less than 90°) in a range that does not hinder the insertion of the light emitting member 4 into the LED fixing portion 21. In this case, the lower bottom surface 23 of the LED fixing portion 21 facing the terminals 44 may also be formed as an inclined surface corresponding to the bending angle of the terminals 44.

Figure 8:
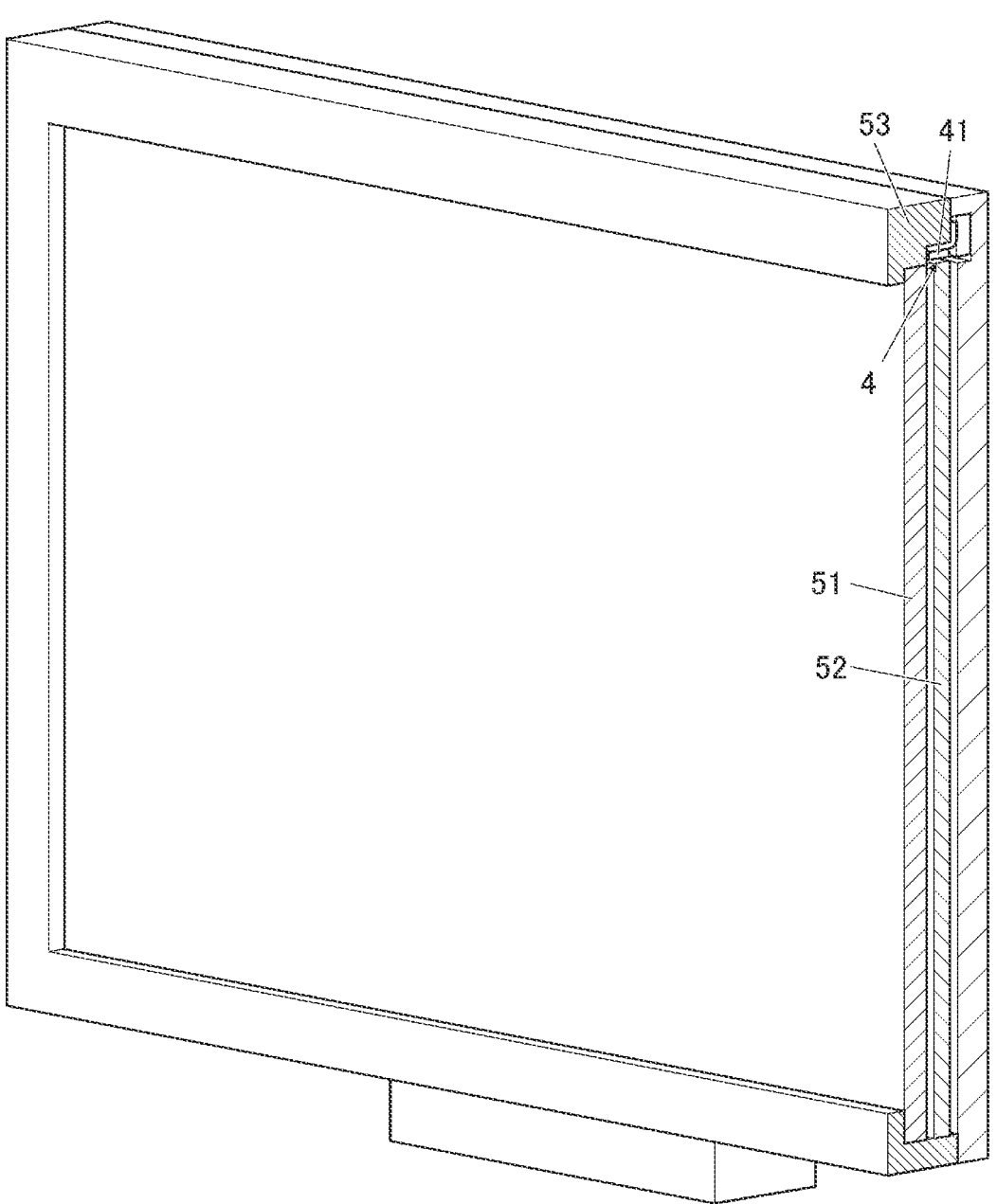
FIG. 8 is a perspective view of a display device to which a light emitting member according to embodiment is attached.

Further, in the above embodiments, a timepiece (wristwatch) has been described as an example of the light source device according to the present disclosure. However, the light source device according to the present disclosure is not limited to timepieces (or devices mounted on timepieces) and can be suitably applied to various devices and structures to which light emitting members having terminals are fixed. FIG. 8 is a perspective view of a display device to which a light emitting member according to embodiment is attached.

As shown in FIG. 8, the light source device according to the present disclosure can be applied to a display device such as a monitor. In the example of this figure, a light emitting member 4 (light emitter 41) as a light source is made to face a side surface of a light guide plate 52 as a backlight for illuminating a liquid crystal panel 51. The light emitting member 4 is supported by a housing 53 as a fixing member.

Also, the light emitter according to the present disclosure is not limited to a light emitting diode (LED).

The invention claimed is:

1. A light source device comprising:

a light emitter;

an electrode including a support that supports the light emitter and a terminal that extends from the support in an opposite direction of a light emitting direction of the light emitter;

a second restrictor that restricts a movement of the electrode in a second direction perpendicular to the light emitting direction; and a third restrictor that restricts a movement of the electrode in a third direction perpendicular to both of the light emitting direction and the second direction, wherein the second restrictor includes a first facing surface that faces an end surface of the support on a first side of the second direction, and wherein the first facing surface is formed in a stepped shape that is located stepwise on a second side of the second direction toward the opposite direction of the light emitting direction of the light emitter.

2. The light source device according to claim 1, wherein the second restrictor restricts a movement of the support of the electrode.

3. The light source device according to claim 1, wherein the third restrictor restricts a movement of the terminal of the electrode.

4. The light source device according to claim 1, further comprising a first restrictor that restricts a movement of the support to an opposite side of the light emitting direction.

5. The light source device according to claim 2, further comprising a first restrictor that restricts a movement of the support to an opposite side of the light emitting direction.

6. The light source device according to claim 3, further comprising a first restrictor that restricts a movement of the support to an opposite side of the light emitting direction.

7. The light source device according to claim 4, further comprising a facing member that faces a light emitting direction side of the light emitter or the electrode.

8. The light source device according to claim 2, wherein the second restrictor includes a first facing surface that faces an end surface of the support on a first side of the second direction.

9. The light source device according to claim 3, wherein the second restrictor includes a first facing surface that faces an end surface of the support on a first side of the second direction.

10. The light source device according to claim 4, wherein the first restrictor and the second restrictor are formed in a same fixing member.

11. The light source device according to claim 5, wherein the first restrictor and the second restrictor are formed in a same fixing member.

12. The light source device according to claim 6, wherein the first restrictor and the second restrictor are formed in a same fixing member.

13. The light source device according to claim 10, wherein the third restrictor includes a second facing surface that faces an end surface in the third direction.

14. The light source device according to claim 13, wherein the second facing surface is formed in a stepped shape that protrudes stepwise in the opposite direction of the light emitting direction of the light emitter.

15. The light source device according to claim 4, wherein a facing member is a light guide that faces a light emitting surface of the light emitter.

16. The light source device according to claim 1, wherein:

the electrode is a first electrode, the light source device further comprises a second electrode, the third restrictor is a rib that is provided between the two electrodes, and a side surface of the rib restricts the movement in the third direction.

17. The light source device according to claim 16, wherein:

the rib is a first rib, a second rib, and the light source device further comprises:

a second rib; and an interconnect that connects a substrate to the terminal of the electrode is provided between the first rib and the second rib.

18. A light source device comprising:

a light emitter;

an electrode including a support that supports the light emitter and a terminal that extends from the support in an opposite direction of a light emitting direction of the light emitter;

a second restrictor that restricts a movement of the electrode in a second direction perpendicular to the light emitting direction;

a third restrictor that restricts a movement of the electrode in a third direction perpendicular to both of the light emitting direction and the second direction; and a first restrictor that restricts a movement of the support to an opposite side of the light emitting direction, wherein the first restrictor and the second restrictor are formed in a same fixing member, wherein the third restrictor includes a second facing surface that faces an end surface in the third direction, and wherein the second facing surface is formed in a stepped shape that protrudes stepwise in the opposite direction of the light emitting direction of the light emitter.

19. A light source device comprising:

a light emitter;

two electrodes, wherein each electrode of the two electrodes includes a support that supports the light emitter and a terminal that extends from the support in an opposite direction of a light emitting direction of the light emitter;

a second restrictor that restricts a movement of the two electrodes in a second direction perpendicular to the light emitting direction; and a third restrictor that restricts a movement of the two electrodes in a third direction perpendicular to both of the light emitting direction and the second direction, wherein:

the third restrictor includes a first rib and a second rib, wherein the first rib and the second rib are provided between the two electrodes, a side surface of each of first rib the second rib restricts the movement in the third direction, an interconnect that connects a substrate to the terminal of the each electrode of the two electrodes is provided between the first rib and the second rib.

20. A method of assembling a light source device that includes:

a light emitting member including:

a light emitter; and an electrode including a support that supports the light emitter and a terminal that extends from the support in an opposite direction of a light emitting direction of the light emitter; and a fixing member including:

a second restrictor that restricts a movement of the electrode in a second direction perpendicular to the light emitting direction; and a third restrictor that restricts a movement of the electrode in a third direction perpendicular to both of the light emitting direction and the second direction, wherein the second restrictor includes a first facing surface that faces an end surface of the support on a first side of the second direction, and wherein the first facing surface is formed in a stepped shape that is located stepwise on a second side of the second direction toward the opposite direction of the light emitting direction of the light emitter, wherein the method comprises:

fitting the light emitting member to the fixing member along the terminal from a light emitting direction side; and arranging the light emitting member in a state in which the movement of the electrode in the second direction is restricted by the second restrictor and the movement of the electrode in the third direction is restricted by the third restrictor.

21. A method of assembling a light source device that includes:

a light emitting member including:

a light emitter; and an electrode including a support that supports the light emitter and a terminal that extends from the support in an opposite direction of a light emitting direction of the light emitter; and a fixing member including:

a second restrictor that restricts a movement of the electrode in a second direction perpendicular to the light emitting direction;

a third restrictor that restricts a movement of the electrode in a third direction perpendicular to both of the light emitting direction and the second direction; and a first restrictor that restricts a movement of the support to an opposite side of the light emitting direction, wherein the first restrictor and the second restrictor are formed in a same fixing member, wherein the third restrictor includes a second facing surface that faces an end surface in the third direction, and wherein the second facing surface is formed in a stepped shape that protrudes stepwise in the opposite direction of the light emitting direction of the light emitter, wherein the method comprises:

fitting the light emitting member to the fixing member along the terminal from a light emitting direction side; and arranging the light emitting member in a state in which the movement of the electrode in the second direction is restricted by the second restrictor, the movement of the electrode in the third direction is restricted by the third restrictor, and the movement of the support to the opposite side of the light emitting direction is restricted by the first restrictor.

22. A method of assembling a light source device that includes:

a light emitting member including:

a light emitter; and two electrodes, wherein each electrode of the two electrodes includes a support that supports the light emitter and a terminal that extends from the support in an opposite direction of a light emitting direction of the light emitter;

a fixing member including:

a second restrictor that restricts a movement of the two electrodes in a second direction perpendicular to the light emitting direction; and a third restrictor that restricts a movement of the two electrodes in a third direction perpendicular to both of the light emitting direction and the second direction, wherein:

the third restrictor includes a first rib and a second rib, wherein the first rib and the second rib are provided between the two electrodes, a side surface of each of the first rib and the second rib restricts the movement in the third direction, an interconnect that connects a substrate to the terminal of the each electrode of the two electrodes is provided between the first rib and the second rib, and wherein the method comprises:

fitting the light emitting member to the fixing member along the terminal from a light emitting direction side; and arranging the light emitting member in a state in which the movement of the two electrodes in the second direction is restricted by the second restrictor and the movement of the two electrodes in the third direction is restricted by the third restrictor.

* * * * *